April 7, 1970 M. F. SLANA 3,505,527

ELECTRONIC DRIVE CIRCUIT EMPLOYING SUCCESSIVELY ENABLED MULTISTATE IMPEDANCE ELEMENTS

Filed April 6, 1967

INVENTOR
M. F. SLANA
BY
R. C. Winter
ATTORNEY

United States Patent Office 3,505,527

Patented Apr. 7, 1970

3,505,527

ELECTRONIC DRIVE CIRCUIT EMPLOYING SUCCESSIVELY ENABLED MULTISTATE IMPEDANCE ELEMENTS

Matthew F. Slana, Naperville, Ill., assignor to Bell Telephone Laboratories, Incorporated, Murray Hill and Berkeley Heights, N.J., a corporation of New York Filed Apr. 6, 1967, Ser. No. 628,874

Int. Cl. H03k *19/14, 23/12*

U.S. Cl. 250—214 7 Claims

ABSTRACT OF THE DISCLOSURE

A drive circuit is disclosed which utilizes a combination of optically enabled, multistate impedance elements such as PNPN diodes to provide a sequence of distinct voltage levels necessary to drive a load comprising another multistate impedance element.

BACKGROUND OF THE INVENTION

Figures 1, 2:
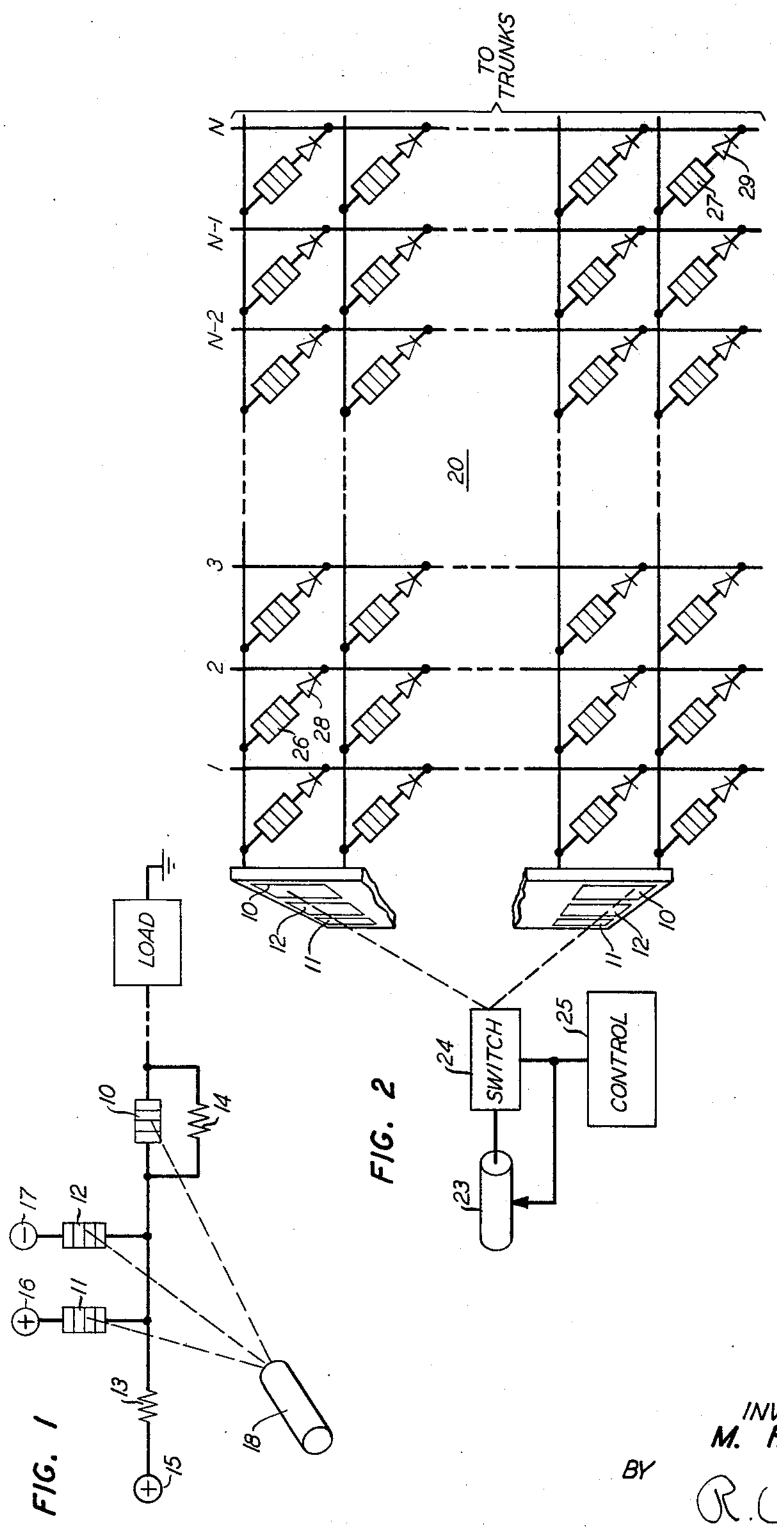

Certain electronic devices have operating characteristics which require distinct voltage levels to enable and sustain them. For instance solid state devices, such as PNPN diodes, require a significantly higher breakdown voltage than that required to sustain them in the enabled state.

Drive circuits for such load devices may comprise mechanical switches which are too slow for the driven circuitry. Also most fast-acting solid state devices are severely limited in their power-handling capacity and thus are unable to accommodate the high power required of these circuits. Nevertheless high speed in the transition between voltage levels is vital to the delicate load elements which cannot tolerate current levels corresponding to the breakdown voltage.

SUMMARY OF THE INVENTION

This problem is solved in accordance with my invention by a drive circuit comprising three photosensitive PNPN diodes connected to a voltage source. Enablement of the first diode completes a path between the voltage source and the load. Enablement of the second diode reduces the voltage level below that required to sustain the first diode but maintains a sustaining voltage level at the load by means of a resistor in shunt with the first diode. The second diode is disabled upon enablement of the third diode, which action serves to remove the sustaining voltage from the load. Advantageously, the photodiodes may be arranged in a matrix which is readily accessed by a light beam positioning system.

DRAWING

FIG. 1 is a schematic representation of the drive circuit in accordance with one illustrative embodiment of the invention; and FIG. 2 is a system arrangement in which the drive circuit of FIG. 1 may be utilized.

DETAILED DESCRIPTION

Turning now to FIG. 1, the drive circuit illustrated therein comprises three multistate impedance elements such as photo-sensitive PNPN diodes 10, 11 and 12, a pair of resistors 13 and 14, positive voltage sources 15 and 16, and negative voltage source 17. Source 15 is more positive than source 16. Diodes 10, 11 and 12 are each connected at one end to resistor 13. Diode 10 is connected in shunt with resistor 14 to the load. The opposite side of the load device, which also may comprise such a multistate impedance element, is grounded. Source 15 provides a voltage level sufficient to break down the load device. Source 16 provides a load sustaining voltage, and source 17 provides a voltage level which restores the load.

The PNPN diode configuration as known in the art exhibits at least one high impedance junction to current flow in either direction. The high impedance condition exists so long as the voltage established across the device remains below a first relatively high threshold level. When the applied voltage is increased, or when the barrier at the critical junction is lowered optically until the applied voltage exceeds this first threshold, the high impedance state is overcome, and the device reverts to a low impedance condition. This latter condition will be maintained so long as a voltage above a second, relatively low, threshold level remains impressed across the device. When this low holding voltage is removed, the sustaining current through the device is interrupted and the device reverts to its high impedance state. Ideally the device affords infinite and zero impedance in its two states corresponding to the open and closed states of a mechanical switch.

Advantageously, diodes 10, 11 and 12 are enabled optically in sequence by a selectively directed light beam from source 18. When diode 10 is enabled optically, previously enabled diode 12 is back biased by the load at ground and restores. Concurrently, the high positive voltage at source 15 is impressed across the load, current flowing through resistor 13 and diode 10. As indicated, this voltage is sufficient to break down the load device.

The load-holding voltage then is provided by enabling diode 11 optically so as to connect the low positive voltage source 16 to diode 10. Source 16 provides voltage of a value sufficient to hold the load device but insufficient to sustain diode 10. Also the potential difference between sources 15 and 16 forward biases diode 11, thereby sustaining it in its low impedance state. When diode 10 is restored to its high impedance state, the load-holding voltage provided by source 16 is impressed across the load via shunt resistor 14.

When it is desired subsequently to release the load device, diode 12 is enabled optically. Negative voltage source 17 back biases diode 11 and the load so that both are restored. Diode 12 is forward biased and sustained in its low impedance state by the potential difference between sources 15 and 17. The circuit now is prepared for another cycle of operation.

As indicated, the diodes may be enabled optically. Thus a photo-sensitive element is contemplated which permits the initial breakdown of the device upon impingement of light thereon. A system appropriate for use of this arrangement is illustrated in FIG. 2. As noted therein, an *n* stage switching network 20 comprises crosspoints of the type disclosed in my patent application Ser. No. 495,156, filed Oct. 12, 1965, now abandoned. Only the control matrix is shown, each crosspoint including a PNPN diode and a photoemissive diode connected in series. Each horizontal is connected to a distinct driver circuit of the type shown in FIG. 1, the driver circuits being arranged in a matrix which is exposed to a light beam from source 23, advantageously a laser, as deflected by switch 24 under control of signals from control circuit 25. The drivers are illustrated in separate blocks 21 and 22, although advantageously they may be contained in a single matrix. The light beam is split so as to impinge two drive circuits simultaneously.

A typical operation would be as illustrated in FIG. 2. Control 25 is advised of a desired connection between lines 2 and *n* which requires that diodes 26 and 27 in the control matrix be enabled. Such enablement results in light emission from diodes 28 and 29 which in turn activates corresponding crosspoint elements in the intelligence transmission path to complete the line-to-line connection via an assigned trunk. Control 25 first directs light from source 23 through switch 24 so as to impinge the diode 10, FIG. 1, in each of the selected drive circuits in network 21 in sequence. This action results in the proper breakdown voltage being impressed across diodes 26 and 27 in sequence and provides end-marking for the desired line-to-line connection. Immediately following such breakdown, control 25 redirects light source 23 through switch 24 so as to impinge diode 11, FIG. 1, in each of the selected drive circuits of marking network 21 in sequence, thereby establishing the necessary holding voltages on diodes 26 and 27 for the duration of the connection. When the connection is terminated, control 25 again commands the light to be redirected, this time to diode 12, FIG. 1, of the appropriate drive circuits. This, of course, serves to remove the holding voltage from diodes 26 and 27, which upon restoring, serve to break the line-to-line connection through the network.

Considering then that the load served by the drive circuit of FIG. 1 is a PNPN diode or other similar multistate impedance element, the voltage at source 15, FIG. 1, is sufficient to exceed the first threshold value of the load device. This operation thus drives the load device to its low impedance condition, as described hereinbefore.

It is to be understood that the above-described arrangements are merely illustrative of the application of the principles of the invention. Numerous other arrangements may be devised by those skilled in the art without departing from the spirit and scope of the invention.

What is claimed is:

1. A circuit for providing three distinct voltage levels across a load comprising first, second and third multistate impedance elements, a voltage source connected to one side of each of said elements, means for enabling said first element to impress the voltage from said source across the load, resistance means shunting said first element, means for enabling said second element to disable said first element and to impress a second voltage across the load via said resistance means and means for enabling said third element to disable said second element.

2. A circuit for driving a multistate impedance load comprising first and second PNPN diodes, means for enabling said first diode to impress a breakdown voltage across the load, resistance means shunting said first diode and means for enabling said second diode to disable said first diode and to impress a holding voltage across the load via said resistance means.

3. A circuit in accordance with claim 2 and further comprising a third PNPN diode and means for enabling said third diode to disable said second diode and to remove the holding voltage from the load.

4. A circuit in accordance with claim 3, wherein said means for enabling said first, second and third diodes comprises a light source and means for directing light from said source to said diodes.

5. In a switching system, means for end-marking a crosspoint network comprising a drive circuit for each horizontal conductor in said network, each of said drive circuits comprising first, second and third multistate impedance devices, and optical means for enabling the first of said devices in a pair of said drive circuits to impress a breakdown voltage across said crosspoint network, for subsequently enabling the second of said devices in said pair of drive circuits to impress a holding voltage across said crosspoint network, and for subsequently enabling the third of said devices in said pair of drive circuits to remove the holding voltage from said crosspoint network upon termination of the network connection.

6. A drive circuit comprising first, second and third PNPN diodes, and first, second and third voltage sources characterized in that said first source is connected to one side of each of said diodes, said second source is connected to the other side of said second diode, said third source is connected to the other side of said third diode and a resistor shunts said first diode, said diodes being enabled in succession to apply the voltage from the corresponding sources to a load.

7. In a switching system, means for end-marking a crosspoint network comprising a drive circuit for each horizontal conductor in said network, each of said drive circuits comprising at least first and second multistate impedance devices, optical means for enabling the first of said devices in a pair of said drive circuits to impress a breakdown voltage across said crosspoint network and for subsequently enabling the second of said devices in said pair of drive circuits to impress a holding voltage across said crosspoint network, and means in shunt of each of said first devices for connecting said holding voltage across said crosspoint network.

References Cited

UNITED STATES PATENTS

| | | | |
|---|---|---|---|
| 2,820,155 | 1/1958 | Linvill | 307—258 X |
| 3,078,373 | 2/1963 | Wittenberg. | |
| 3,145,301 | 8/1964 | Spruth. | |
| 3,167,664 | 1/1965 | Stascavage | 307—284 |
| 3,223,978 | 12/1965 | Johnson | 307—258 X |
| 3,371,230 | 2/1968 | Blank et al. | 307—284 |

OTHER REFERENCES

McDermott, PNPN Diodes, Electronics, November 1961, pp. 125–35. Pertinent: pp. 125, 307–305.

RALPH G. NILSON, Primary Examiner

CHARLES M. LEEDOM, Assistant Examiner

U.S. Cl. X.R.

250—217; 307—305, 311